(12) United States Patent
Xie et al.

(10) Patent No.: US 11,646,362 B2
(45) Date of Patent: May 9, 2023

(54) VERTICAL TRANSPORT FIELD-EFFECT TRANSISTOR STRUCTURE HAVING INCREASED EFFECTIVE WIDTH AND SELF-ALIGNED ANCHOR FOR SOURCE/DRAIN REGION FORMATION

(71) Applicant: International Business Machines Corporation, Armonk, NY (US)

(72) Inventors: Ruilong Xie, Niskayuna, NY (US); Alexander Reznicek, Troy, NY (US); Takashi Ando, Eastchester, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 17/458,792

(22) Filed: Aug. 27, 2021

(65) Prior Publication Data
US 2021/0391444 A1  Dec. 16, 2021

Related U.S. Application Data

(62) Division of application No. 16/548,130, filed on Aug. 22, 2019, now Pat. No. 11,189,712.

(51) Int. Cl.
*H01L 29/66* (2006.01)
*H01L 29/08* (2006.01)
*H01L 29/78* (2006.01)

(52) U.S. Cl.
CPC ...... *H01L 29/6681* (2013.01); *H01L 29/0847* (2013.01); *H01L 29/66666* (2013.01); *H01L 29/785* (2013.01); *H01L 29/7827* (2013.01)

(58) Field of Classification Search
CPC ............ H01L 29/6681; H01L 29/0847; H01L 29/66666; H01L 29/7827; H01L 29/785
See application file for complete search history.

(56) References Cited

U.S. PATENT DOCUMENTS

| | | | |
|---|---|---|---|
| 9,006,057 B2 | 4/2015 | Qin et al. | |
| 9,202,921 B2 | 12/2015 | Wu | |

(Continued)

FOREIGN PATENT DOCUMENTS

| | | |
|---|---|---|
| CN | 1074714 C | 11/2001 |
| CN | 101395714 A | 3/2009 |

(Continued)

OTHER PUBLICATIONS

List of IBM Patents or Patent Applications Treated as Related.

*Primary Examiner* — Michael Jung
(74) *Attorney, Agent, or Firm* — Jeffrey S LaBaw; Ryan, Mason & Lewis, LLP

(57) ABSTRACT

A method for manufacturing a semiconductor device includes forming a plurality of fins on a substrate. The plurality of fins each include a first portion having a first width, and a second portion having a second width greater than the first width. The method also includes forming a sacrificial layer on the substrate in a space between a first fin and a second fin of the plurality of fins, wherein the first fin and the second fin correspond to a vertical transistor. In the method, lower portions of the first and second fins are removed, and an epitaxial region is formed under remaining portions of the first and second fins. The sacrificial layer is removed from the space between the first fin and the second fin after forming the epitaxial region.

20 Claims, 11 Drawing Sheets

(56) References Cited

U.S. PATENT DOCUMENTS

| | | |
|---|---|---|
| 9,385,218 B1 | 7/2016 | Cheng et al. |
| 9,716,170 B1 | 7/2017 | Cheng et al. |
| 9,780,197 B1 | 10/2017 | Xie et al. |
| 9,837,405 B1 * | 12/2017 | Cheng ............... H01L 21/31111 |
| 9,893,191 B2 | 2/2018 | Wen et al. |
| 10,020,395 B2 | 7/2018 | Pawlak |
| 10,157,798 B1 | 12/2018 | Chi et al. |
| 2015/0255542 A1 | 9/2015 | Cai et al. |
| 2018/0075182 A1 | 3/2018 | Zhuang et al. |
| 2018/0226491 A1 | 8/2018 | Bi et al. |
| 2018/0286980 A1 * | 10/2018 | Bi ........................ H01L 29/785 |
| 2018/0366545 A1 | 12/2018 | Deng et al. |

FOREIGN PATENT DOCUMENTS

| | | |
|---|---|---|
| CN | 103956338 B | 11/2016 |
| JP | 10-5230 A | 1/1998 |
| KR | 100987114 B1 | 10/2010 |
| RU | 2012129245 A | 1/2014 |

\* cited by examiner

100

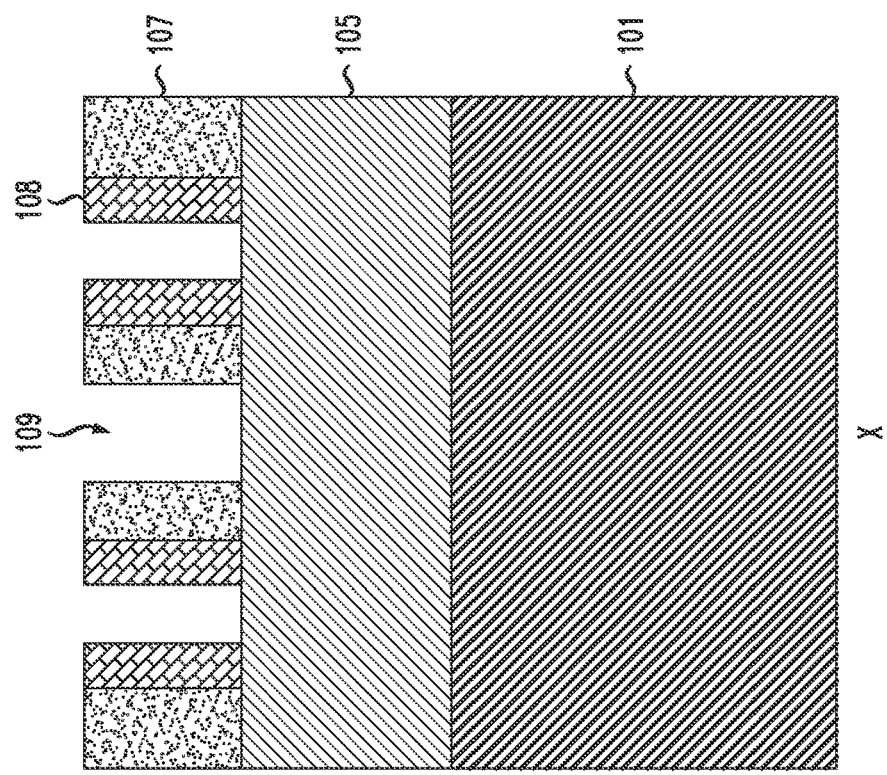
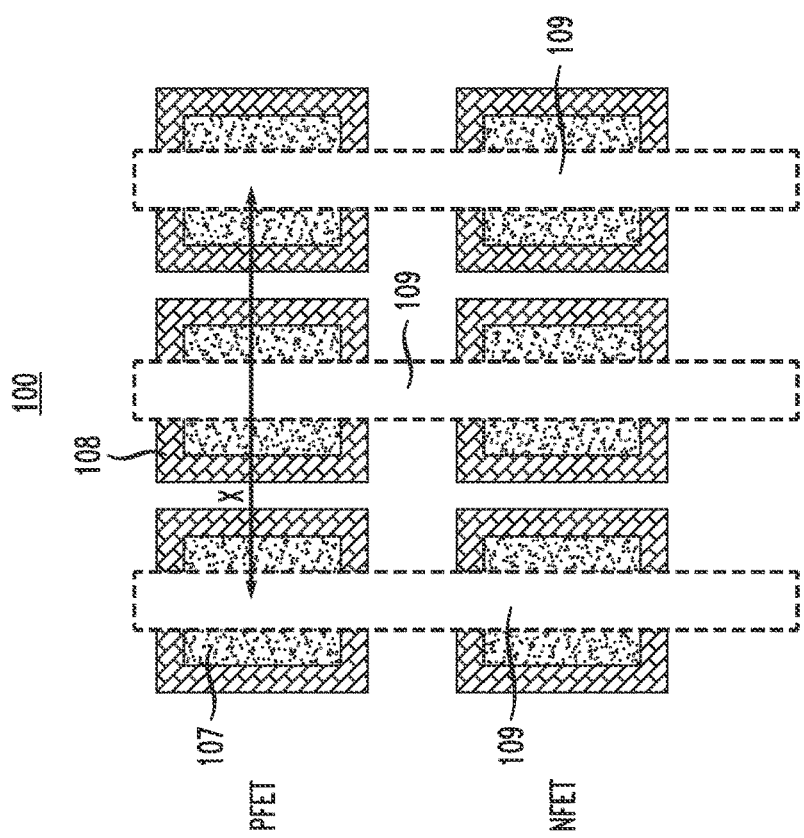
FIG. 2A
FIG. 2B

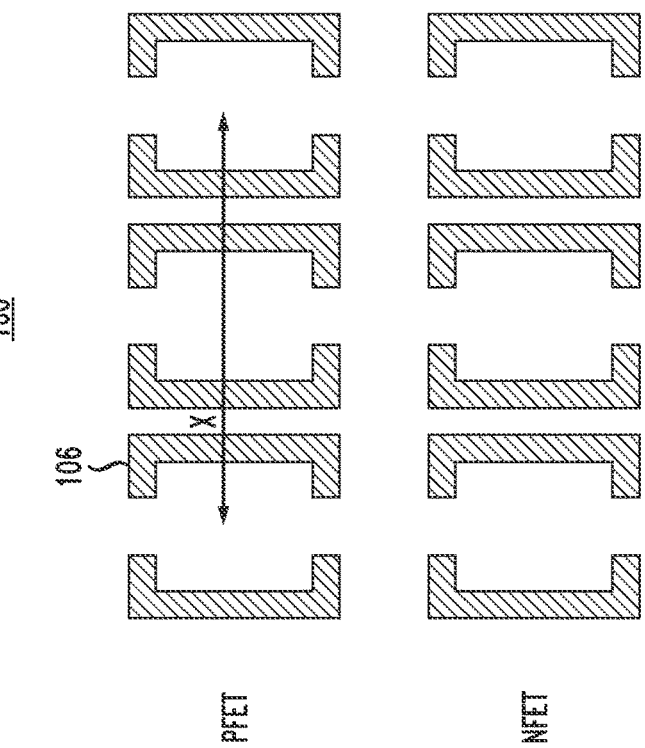
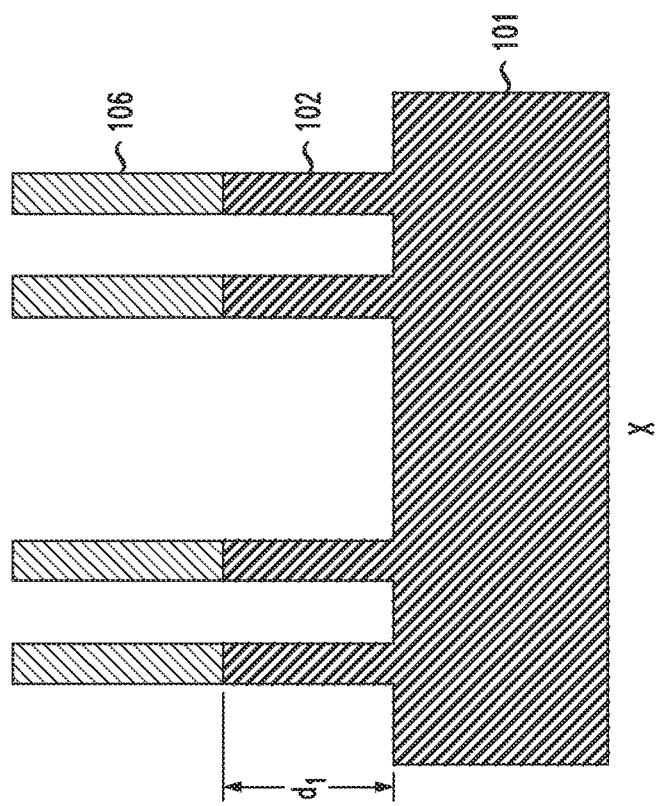

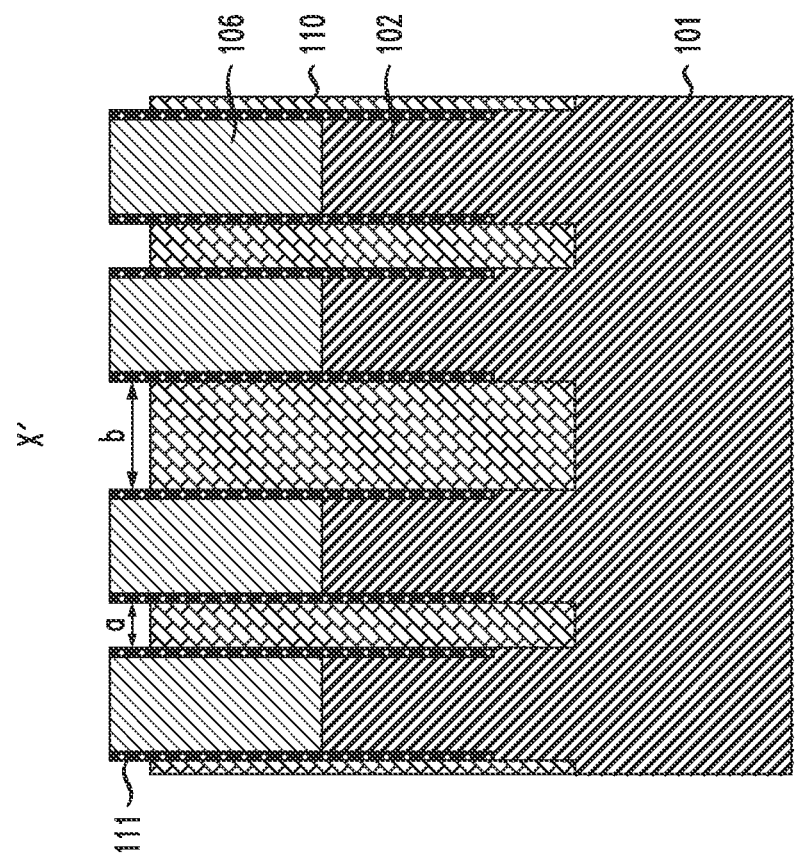
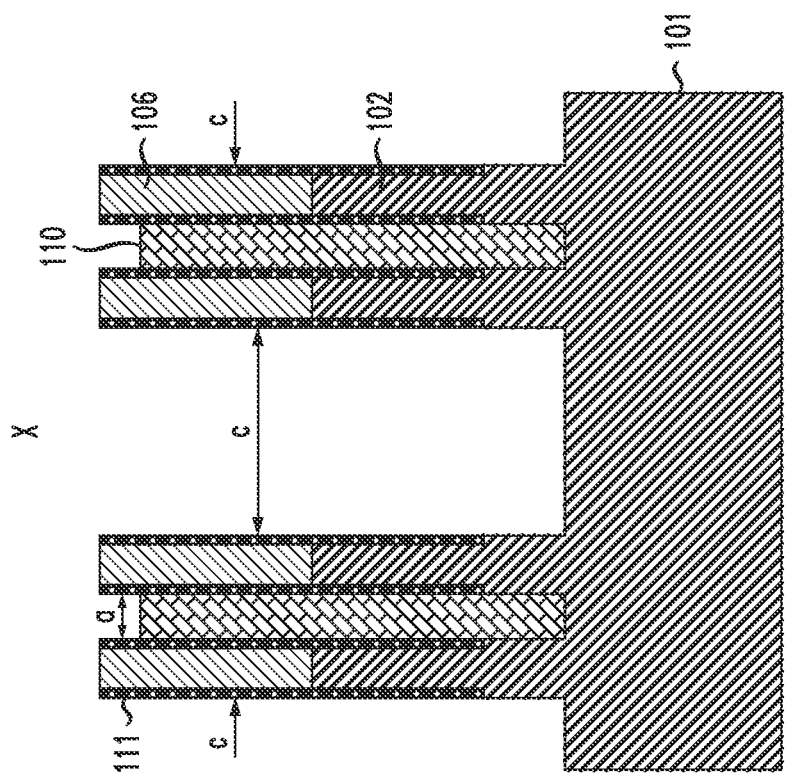

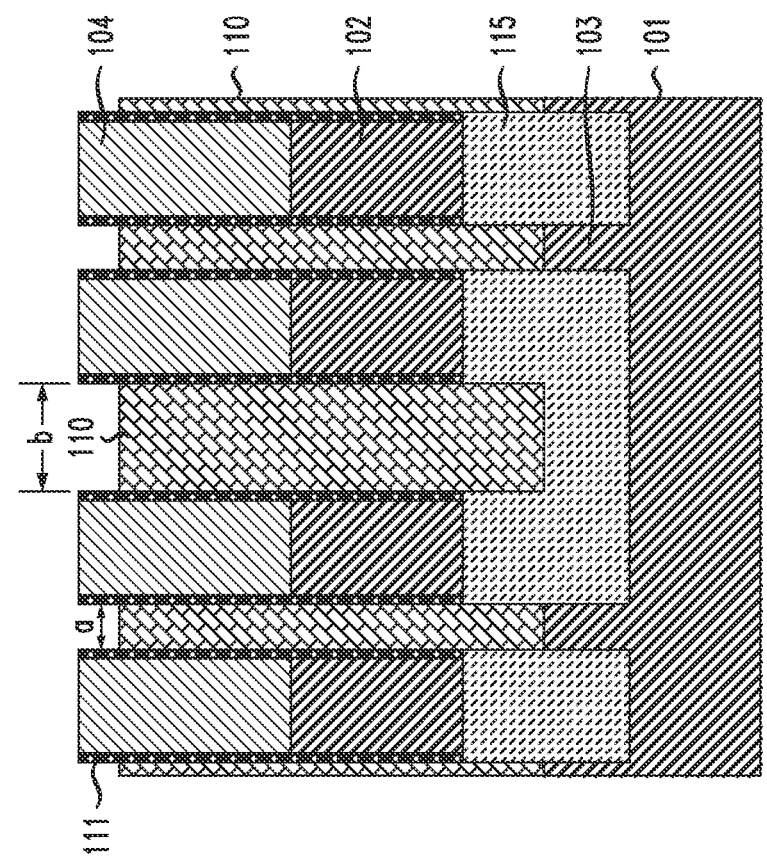
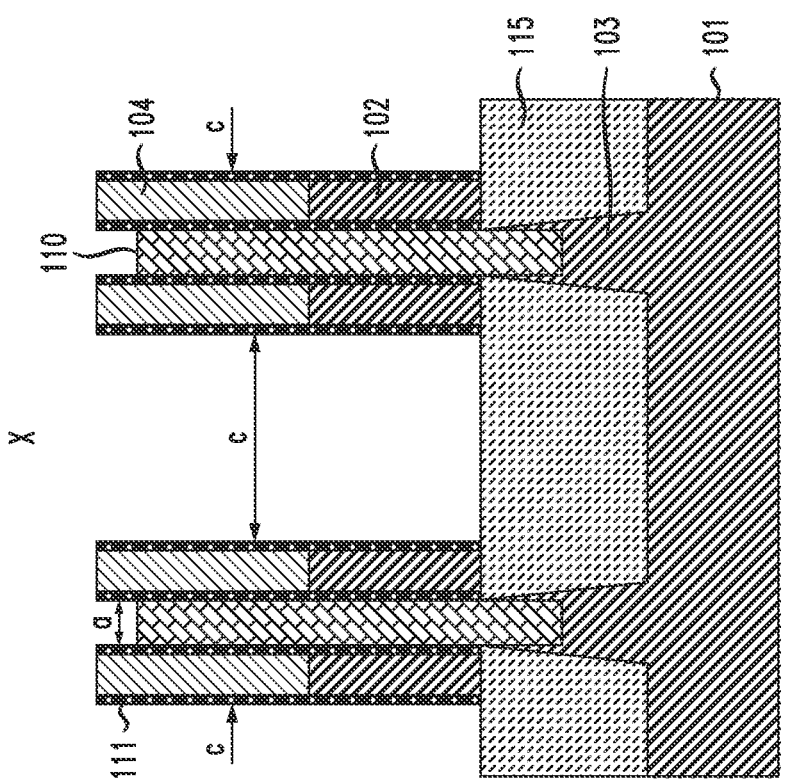

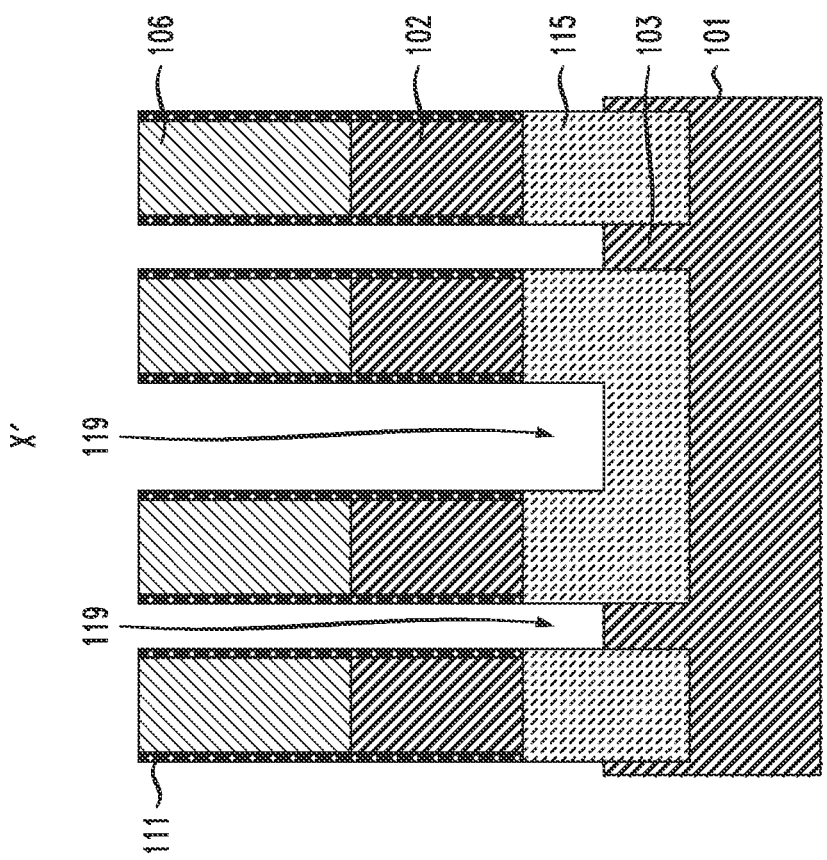
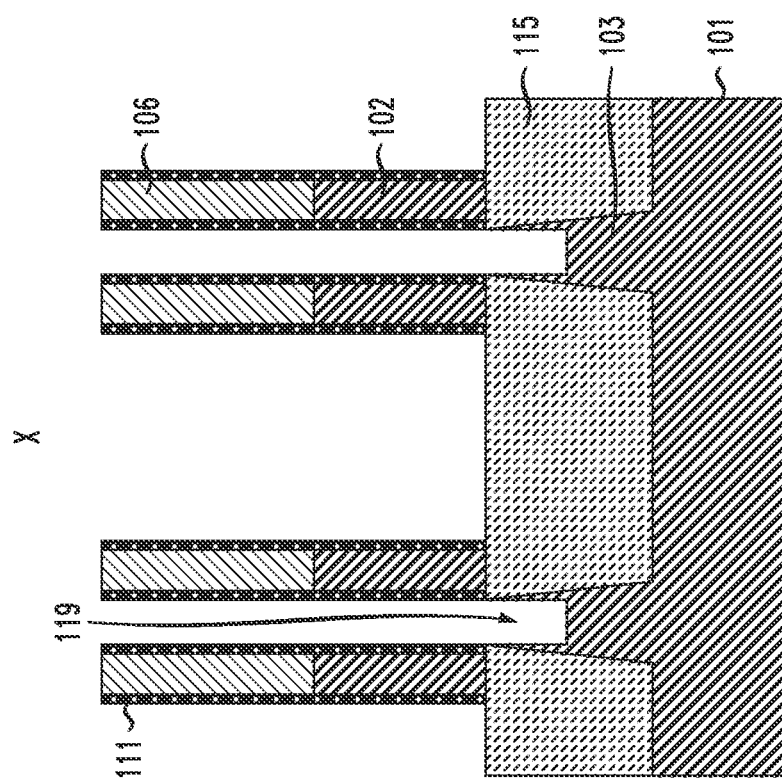
FIG. 9A
FIG. 9B

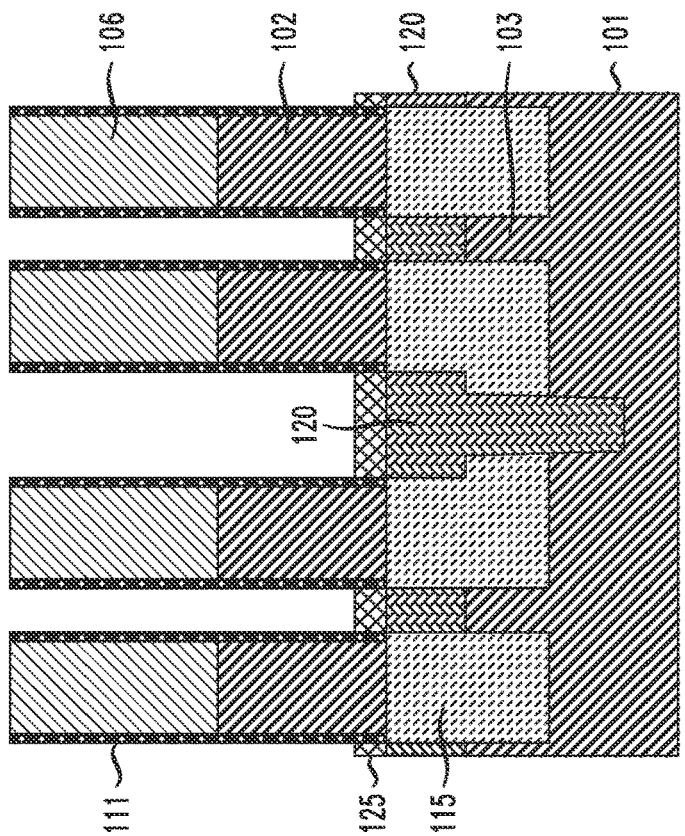
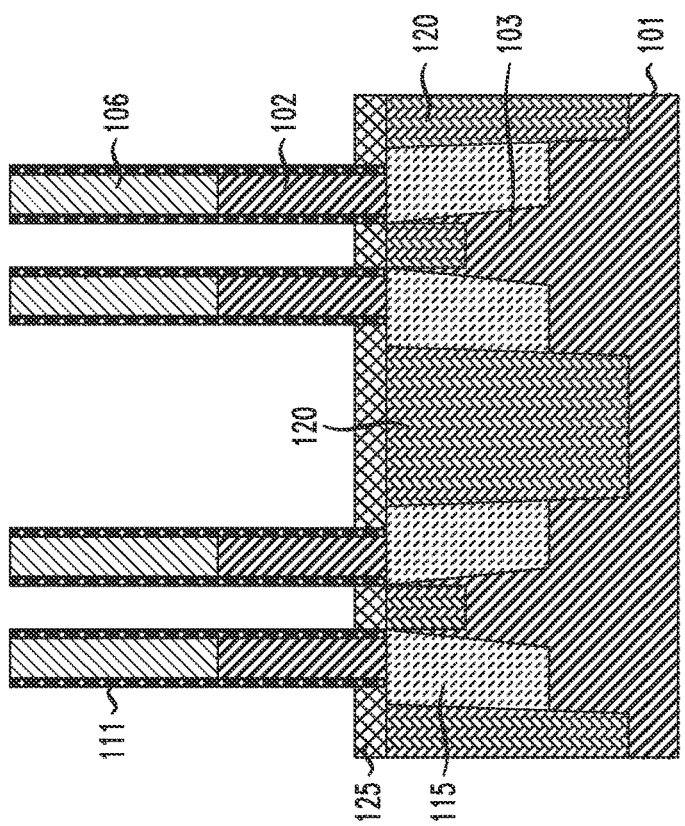

VERTICAL TRANSPORT FIELD-EFFECT TRANSISTOR STRUCTURE HAVING INCREASED EFFECTIVE WIDTH AND SELF-ALIGNED ANCHOR FOR SOURCE/DRAIN REGION FORMATION

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction.

Vertical transport field-effect transistors (VTFETs) are becoming viable device options for smaller scale semiconductor devices, such as, for example, devices beyond the 7 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

Bottom source/drain regions under channel regions have been determined to result in better performing VTFETs. However, conventional VTFET process flows typically result in small volume epitaxial source/drain regions being formed away from a bottom of a channel region, especially for single fin devices. In addition, conventional VTFET manufacturing processes attempting to form source/drain regions under fin channel regions reduce mechanical stability of the fins.

SUMMARY

According to an exemplary embodiment of the present invention, a method for manufacturing a semiconductor device includes forming a plurality of fins on a substrate. The plurality of fins each include a first portion having a first width, and a second portion having a second width greater than the first width. The method also includes forming a sacrificial layer on the substrate in a space between a first fin and a second fin of the plurality of fins, wherein the first fin and the second fin correspond to a vertical transistor. In the method, lower portions of the first and second fins are removed, and an epitaxial region is formed under remaining portions of the first and second fins. The sacrificial layer is removed from the space between the first fin and the second fin after forming the epitaxial region.

According to an exemplary embodiment of the present invention, a semiconductor device includes a plurality of fins disposed on a substrate. The plurality of fins each include a first portion having a first width, and a second portion having a second width greater than the first width. A plurality of bottom source/drain regions are respectively disposed under an entirety of the plurality of fins along a width direction.

According to an exemplary embodiment of the present invention, a method for manufacturing a semiconductor device includes forming a plurality of fins on a substrate. The plurality of fins are each formed in a C-shape. The method also includes forming a sacrificial layer on the substrate in a space between a first fin and a second fin of the plurality of fins, wherein the first fin and the second fin correspond to a vertical transistor. In the method, lower portions of the first and second fins are removed, and an epitaxial region is formed under remaining portions of the first and second fins. The sacrificial layer is removed from the space between the first fin and the second fin after forming the epitaxial region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 2A is a top view illustrating removal of portions of the mandrels and spacers in a method of manufacturing a semiconductor device, according to an exemplary embodiment of the present invention.

FIG. 2B is cross-sectional view taken along the line X in FIG. 2A and illustrating removal of portions of the mandrels and spacers in a method of manufacturing a semiconductor device, according to an exemplary embodiment of the present invention.

FIG. 3A is top view illustrating mandrel removal and fin formation in a method of manufacturing a semiconductor device, according to an exemplary embodiment of the present invention.

FIG. 3B is cross-sectional view taken along the line X in FIG. 3A and illustrating mandrel removal and fin formation in a method of manufacturing a semiconductor device, according to an exemplary embodiment of the present invention.

FIG. 6A is a cross-sectional view taken along the line X in FIG. 4 and illustrating isotropic removal of portions of the sacrificial layer in a method of manufacturing a semiconductor device, according to an exemplary embodiment of the present invention.

FIG. 6B is a cross-sectional view taken along the line X' in FIG. 4 and illustrating isotropic removal of portions of the sacrificial layer in a method of manufacturing a semiconductor device, according to an exemplary embodiment of the present invention.

FIG. 8A is a cross-sectional view taken along the line X in FIG. 4 and illustrating growth of bottom epitaxial layers in a method of manufacturing a semiconductor device, according to an exemplary embodiment of the present invention.

FIG. 8B is a cross-sectional view taken along the line X' in FIG. 4 and illustrating growth of bottom epitaxial layers in a method of manufacturing a semiconductor device, according to an exemplary embodiment of the present invention.

FIG. 9A is a cross-sectional view taken along the line X in FIG. 4 and illustrating removal of remaining portions of the sacrificial layer in a method of manufacturing a semiconductor device, according to an exemplary embodiment of the present invention.

FIG. 9B is a cross-sectional view taken along the line X' in FIG. 4 and illustrating removal of remaining portions of the sacrificial layer in a method of manufacturing a semiconductor device, according to an exemplary embodiment of the present invention.

FIG. 10A is a cross-sectional view taken along the line X in FIG. 4 and illustrating bottom spacer and isolation region formation in a method of manufacturing a semiconductor device, according to an exemplary embodiment of the present invention.

FIG. 10B is a cross-sectional view taken along the line X' in FIG. 4 and illustrating bottom spacer and isolation region formation in a method of manufacturing a semiconductor device, according to an exemplary embodiment of the present invention.

DETAILED DESCRIPTION

Figure 1:
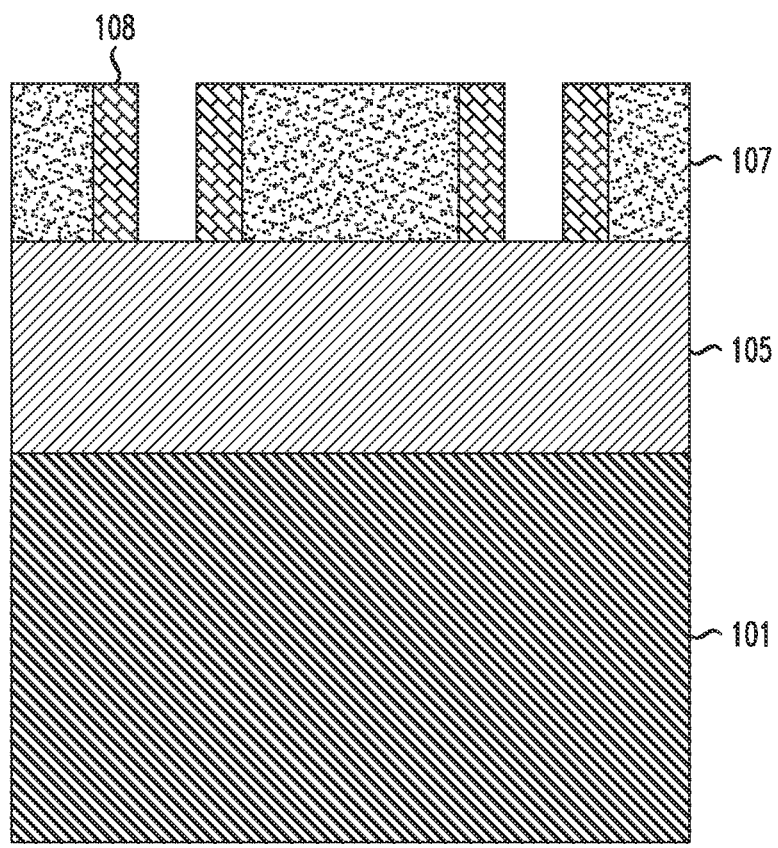
FIG. 1 is a cross-sectional view illustrating mandrel and spacer formation in a method of manufacturing a semiconductor device, according to an exemplary embodiment of the present invention.

Exemplary embodiments of the invention will now be discussed in further detail with regard to semiconductor devices and methods of manufacturing same and, in particular, to VTFET devices including bottom source/drain regions under fin channel regions and fin channel regions having a shape including portions with increased width.

It is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VTFETs, CMOSs, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, region, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention correspond to methods of fabricating and structures for VTFETs, where bottom source/drain epitaxial regions are formed directly under the fin channel regions. A sacrificial layer functions as a self-aligned anchor maintaining mechanical stability of the fins during recessing of portions of the fins and substrate, and growth of a bottom epitaxial region under the fins. The fin channel regions have a C-shaped configuration, so that portions of the fins have greater widths, increasing the effective width (War) of the fins with respect to conventional fin configurations. The increase in War is achieved without increasing cell height.

FIG. 1 is a cross-sectional view illustrating mandrel and spacer formation in a method of manufacturing a semiconductor device, according to an exemplary embodiment of the present invention. Referring to FIG. 1, a semiconductor substrate 101 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer.

A hardmask layer 105 including, for example, a nitride material, such as, but not necessarily limited to, silicon nitride (SiN) or titanium nitride (TiN), is formed on the substrate 101. The hardmask layer 105 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess hardmask material. A height of the hardmask layer 105 can be in the range of, but is not necessarily limited to, 20 nm to 100 nm.

A plurality of mandrels 107 comprising, but not necessarily limited to, amorphous silicon (a-Si), amorphous carbon, polycrystalline silicon, polycrystalline silicon germanium, amorphous silicon germanium, polycrystalline germanium, and/or amorphous germanium, are formed on hardmask layer 105 to be spaced apart from each other. The mandrel formation can be done by various patterning techniques, including, but not necessarily limited to, lithography patterning followed by directional etching and/or a sidewall image transfer (SIT) process, for example. In some embodiments, the process includes using lithography followed by directional etching (e.g., reactive ion etch (ME)) to form mandrels 107. After mandrel formation, a conformal film can be deposited and then followed by an etchback process (e.g., ME). The conformal film will form spacers 108 around vertical sides of each mandrel 107. The spacer material can include, but is not limited, an oxide, such as silicon oxide ($SiO_x$) (where x is, for example, 2 in the case of silicon dioxide ($SiO_2$), or 1.99 or 2.01), formed by low-pressure chemical vapor deposition (LPCVD), PECVD, sub-atmospheric chemical vapor deposition (SACVD), rapid thermal chemical vapor deposition (RTCVD), in-situ radical assisted deposition, high temperature oxide (HTO) deposition, low temperature oxide (LTO) deposition, ozone/TEOS deposition, limited reaction processing CVD (LRPCVD). Alternatively, some other dielectric materials, such as SiOCN, SiCN, SiOC, can be used as the material for the spacers 108. A height of the mandrels 107 and corresponding spacers 108 can be in the range of, but is not necessarily limited to, 30 nm to 100 nm.

Referring to FIGS. 2A and 2B, central portions of the mandrels 107 and spacers 108 are removed to form openings 109 in addition to the spaces between adjacent spacers 108 on the mandrels 107. The openings 109 expose portions of a top surface of the hardmask layer 105 and are formed using an etching process such as, for example, a plasma dry etch. The mandrels 107 and spacers 108 are formed on the hardmask layer 105 in p-type FET (PFET) and n-type FET (NFET) regions, where respective PFET and NFET devices will be formed.

Referring to FIGS. 3A and 3B, fins 102 are formed by patterning part of the substrate 101 into the fins 102. In order to form the fins 102, the mandrels 107 are selectively removed with respect to the spacers 108. The selective removal of the mandrels 107 is performed using, for example, an isotropic wet or dry etch process. The selective removal of the mandrels 107 leaves the spacers 108 on the hardmask layer 105. Referring to FIG. 2A, the remaining portions of the spacers 108 are "C-shaped" following removal of the central portions as described in connection with FIGS. 2A and 2B. Referring to FIGS. 3A and 3B, the hardmask layer 105 is patterned into a plurality of patterned hardmask portions 106 corresponding to the locations of the overlying spacers 108 so that the underlying patterned hardmask portions 106 have the C-shape of the spacers 108. More specifically, exposed portions of the hardmask layer 105 not under the spacers 108 (e.g., not masked by the spacers 108) are removed using, for example, a directional etching process, comprising RIE using $CF_8$, $CH_2F_2$ or other chemistry as is known to etch, for example, silicon nitride selective to other materials. The patterning of the hardmask layer 105 into the plurality of patterned hardmask portions 106 spaced apart from each other can be performed using, for example, SAMP techniques, including, but not necessarily limited to, SADP, SAQP and SAOP.

Following removal of the spacers 108, using the patterned hardmask portions 106 as masks, exposed portions of the substrate 101 not covered by the hardmask portions 106 are removed to certain depth d1 (depending on design) using a substrate etch. The substrate etch transfers the pattern of the hardmask portions 106 to the substrate to form the fins 102, which have the same C-shape as the overlying hardmask portions 106. In accordance with an embodiment, substrate 101 including a semiconductor material, such as, Si, SiGe, SiC, Si:C, SiGeC, SiGe:C, III-V, II-V compound semiconductor or other like semiconductor, can be selectively etched with respect to the hardmask portions 106 using, for example, a silicon RIE process.

While embodiments of the present invention describe channel regions as fins, the embodiments are not necessarily limited to fin channel regions, and may include nanowire channel regions. In addition, although four fins 102 are shown in the figures for ease of explanation, more or less than four fins can be formed.

Figure 4:
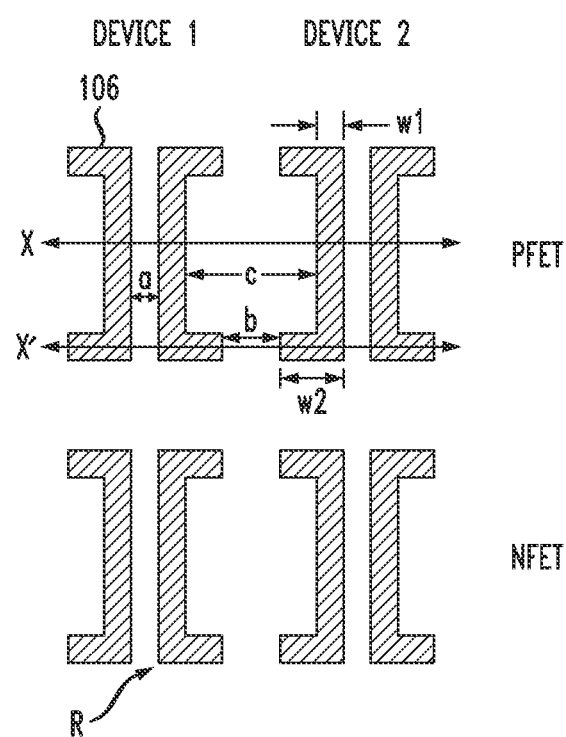
FIG. 4 is a top view illustrating different widths of portions of a hardmask and underlying fins, and different spacing between the portions of a hardmask and underlying fins in a method of manufacturing a semiconductor device, according to an exemplary embodiment of the present invention.
Figure 5A:
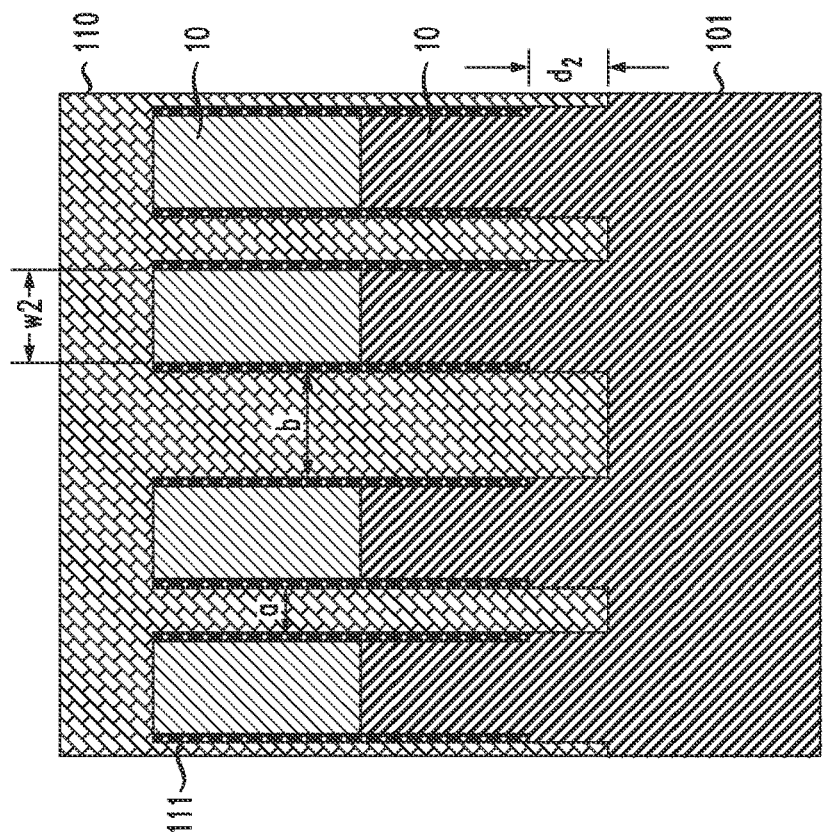
FIG. 5A is a cross-sectional view taken along the line X in FIG. 4 and illustrating fin recessing, and sidewall liner and sacrificial layer deposition in a method of manufacturing a semiconductor device, according to an exemplary embodiment of the present invention.
Figure 5B:
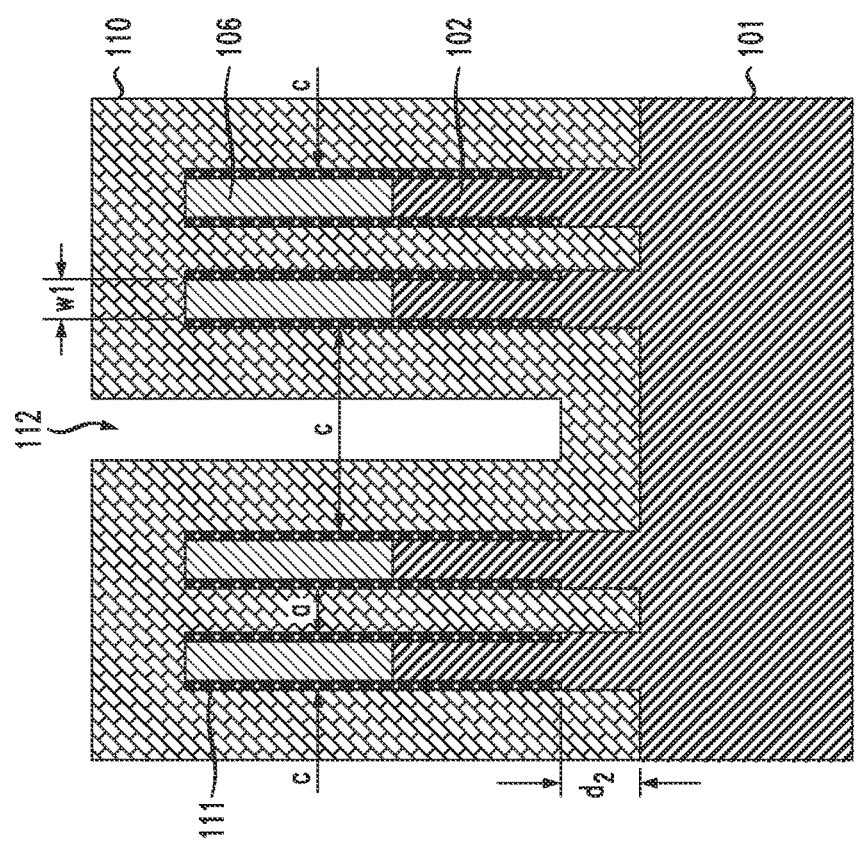
FIG. 5B is a cross-sectional view taken along the line X' in FIG. 4 and illustrating fin recessing, and sidewall liner and sacrificial layer deposition in a method of manufacturing a semiconductor device, according to an exemplary embodiment of the present invention.

Referring to FIGS. 4, 5A and 5B, different widths w1 and w2 of hardmask portions 106 and underlying fins 102, and different spacing a, b and c (as shown by the arrows) between the hardmask portions 106 and underlying fins 102 including sidewall liner layers 111 thereon are shown. In more detail, devices 1 and 2 will be respectively formed in both PFET and NFET device regions. As can be seen in FIG. 4, each of the devices 1 and 2 includes two outward facing C-shaped fins 102 (not shown (under the hardmask portions 106)). In other words, the C-shapes in each of the devices 1 and 2 face opposite directions. Wider portions (horizontal portions in FIG. 4) of the C-shaped fins 102 (and overlying hardmask portions 106) have a width w2, and narrower portions (vertical portions in FIG. 4) of the C-shaped fins 102 (and overlying hardmask portions 106) have a width w1. Referring to the cross-sections X and X' in FIGS. 5A and 5B, sidewall liner layers 111 are formed on the sides of the hardmask portions 106 and fins 102. A thickness of the sidewall liner layers 111 is about 1 nm to about 6 nm. The sidewall liner layers 111 are formed by conformal deposition of a thin dielectric layer followed by anisotropic RIE. A fin height covered by the sidewall liner layers 111 is about 15 nm to about 45 nm. Then, a selective ME (e.g., selective silicon ME) is performed to recess the substrate 101, which is not covered by the sidewall liner layers 111 to a depth D2 to form lower portions of the fins 102 not covered by sidewall liner layers 111. The depth D2 is, for example, about 15 nm to about 40 nm.

As shown by the double-sided arrows, the width of the inner space a between two C-shaped fins 102 (including the liner layer 111 thereon) of the same device 1 or 2 is less than the width of the space b between ends of the wider portions of the fins 102 (including the liner layer 111 thereon) of two neighboring devices, and also less than the width of the space c between adjacent sides of the narrower portions of the fins 102 (including the liner layer 111 thereon) of two neighboring devices. In addition, the width of the space b is less than the width of the space c. The C-shaped configuration of the fins 102 results in an increased effective width (War) of the fins 102 with respect to fins patterned to include only narrower portions (e.g., vertical portions in FIG. 4) and not wider portions (e.g., horizontal portions in FIG. 4). According to an embodiment, although not shown, a corner R between narrower and wider portions of a fin 102 can be rounded.

Referring to FIGS. 5A and 5B, following formation of the sidewall liner layers 111 and selective recessing to form the lower portions of the fins 102, a sacrificial layer 110 is deposited on the substrate 101, and on and around the stacked structures including the patterned hardmask portions 106, the fins 102 and the sidewall liner layers 111. The sacrificial layer 110 comprises, for example, titanium oxide, aluminum oxide, and/or LTO, and is deposited using conformal deposition techniques, such as, for example, ALD or CVD. Due to the conformal nature of the deposition process, where material is deposited and formed on all exposed surfaces, areas with less space between structures (e.g., spaces a and b) are filled in before areas with more space between structures (e.g., spaces c). In spaces a and b, pinch-off occurs, whereas in spaces c, pinch-off does not occur. As can be seen in FIG. 5A, a portion 112 of a space c between adjacent sides of the liner layer 111 on narrower portions of the fins 102 of two neighboring devices remains vacant, and is not filled with the sacrificial layer 110, whereas the spaces a between adjacent sides of the liner layer 111 on two C-shaped fins 102 of the same device 1 or 2, and the spaces b between adjacent sides of the liner layer 111 on ends of the wider portions of the fins 102 of two neighboring devices are filled in by the sacrificial layer 110. The sacrificial layer 110 has a thickness on top surfaces of the stacked structures including the patterned hardmask portions 106, the fins 102 and the sidewall liner layers 111.

Referring to FIGS. 6A and 6B, portions of the sacrificial layer 110 are isotropically removed from the spaces c between adjacent sides of the liner layer 111 on narrower portions of the fins 102 of two neighboring devices, where pinch-off did not occur. The sacrificial layer 110 remains where pinch-off occurred, in the spaces a between adjacent sides of the liner layer 111 on two C-shaped fins 102 of the same device 1 or 2, and in the spaces b between adjacent sides of the liner layer 111 on ends of the wider portions of the fins 102 of two neighboring devices. As can be seen in FIGS. 6A and 6B, the isotropic removal of the portions of the sacrificial layer 110 reduces a vertical height of the sacrificial layer 110 to, for example, below the top surface of the hardmask portions 106. The isotropic removal of the portions of the sacrificial layer 110 is performed using for example, isotropic wet or dry etch processes.

Figure 7A:
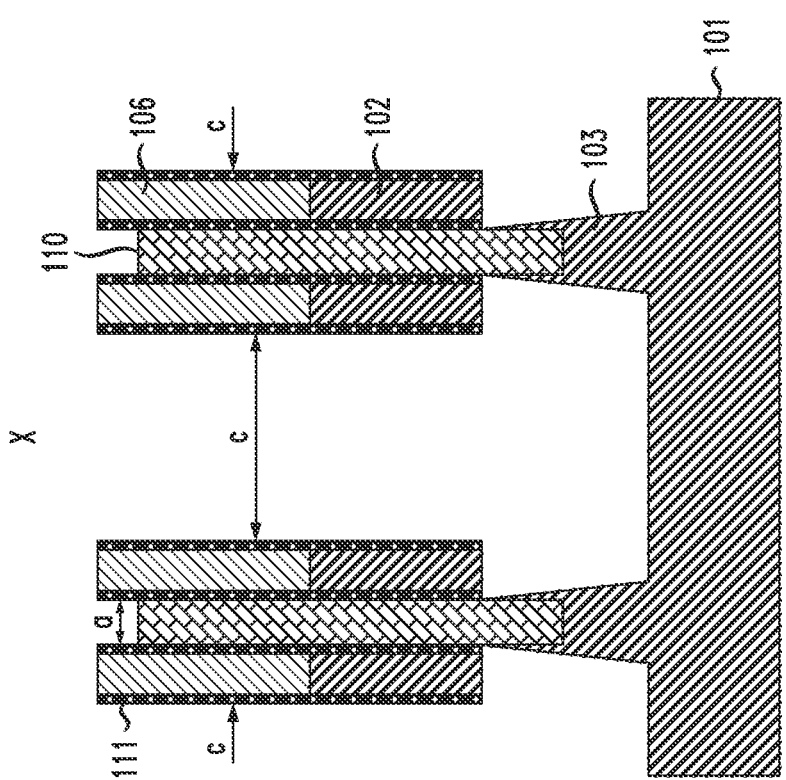
FIG. 7A is a cross-sectional view taken along the line X in FIG. 4 and illustrating removal of portions of fins and the substrate in a method of manufacturing a semiconductor device, according to an exemplary embodiment of the present invention.
Figure 7B:
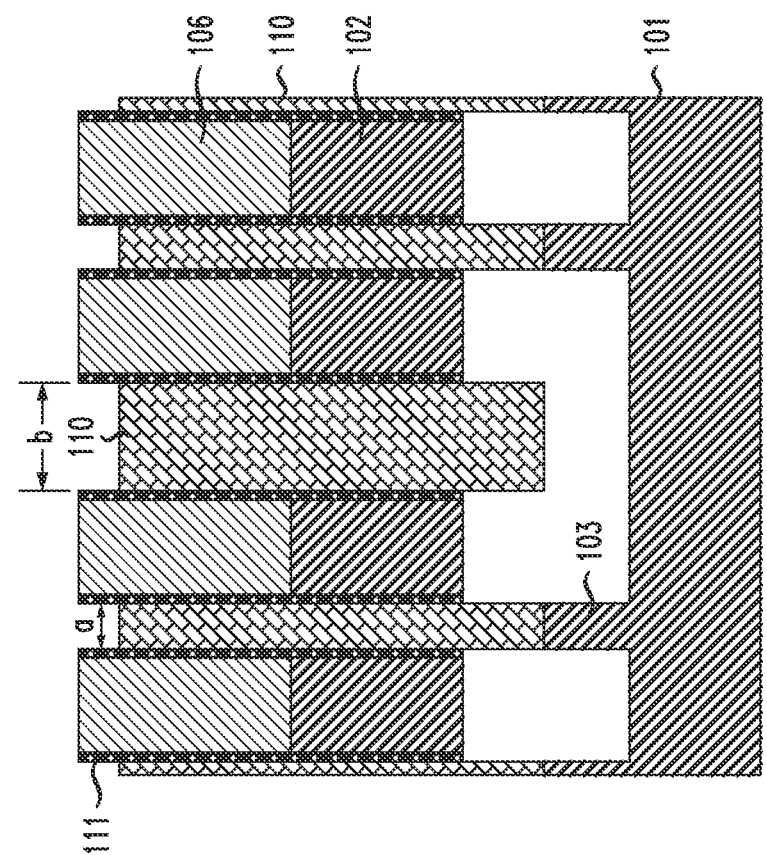
FIG. 7B is a cross-sectional view taken along the line X' in FIG. 4 and illustrating removal of portions of fins and the substrate in a method of manufacturing a semiconductor device, according to an exemplary embodiment of the present invention.

Referring to FIGS. 7A and 7B, exposed portions of the fins 102 and the substrate 101 are etched to result in pedestal portions 103 under remaining portions of the sacrificial layer 110 in the spaces a. A majority or all of the exposed portions of the fins 102 not covered by the sidewall liner layer 111 are removed from lateral sides by the etching process, which is performed using, for example, a selective Si etching process. In addition, the etching process recesses the substrate 101 to a lower height to result in the pedestal portions 103. As can be seen in FIG. 7A, one or more of the pedestal portions 103 may have a negative taper, where the pedestal portion 103 becomes wider from a top to a bottom of the pedestal portion 103. The remaining portions of the sacrificial layer 110 in the spaces b, and on the pedestal portions 103 in the spaces a, provide mechanical stability for the stacked structures including the hardmask portions 106 on the remaining portions of the fins 102, which are on sides of the remaining portions of the sacrificial layer 110. Accordingly, the remaining portions of the sacrificial layer 110 in the spaces b, and on the pedestal portions 103 in the spaces a, provide a self-aligned anchor structure for the stacked structures by supporting the stacked structures when the lower portions of the fins 102 are removed. As shown in FIGS. 7A and 7B, portions directly under the remaining portions of the fins 102 are left vacant by the etching, thereby eliminating a supporting layer and creating an empty space under each of the stacked structures between the stacked structures and the substrate 101. By bracing the stacked structures from their lateral sides, the remaining portions of the sacrificial layer 110 in spaces a and b provide lateral support along a majority of the lateral sides for the stacked structures including the hardmask portions 106 and the remaining portions of the fins 102.

Referring to FIGS. 8A and 8B, epitaxial layers 115 are epitaxially grown from exposed portions of the substrate 101, bottom surfaces of the fins 102 and pedestal portions 103, so that at least portions of the epitaxial layers 115 are positioned directly under the remaining portions of the fins 102, which will function as channel regions in resulting NFET or PFET devices. The epitaxially grown layers 115, at least portions of which will function as bottom source/drain regions, can be in-situ doped, meaning dopants are incorporated into the epitaxy film during the epitaxy process.

Other alternative doping techniques can be used, including but not necessarily limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Referring to FIGS. 9A and 9B, the remaining portions of the sacrificial layer 110 in the spaces a and b are selectively removed using, for example, buffered hydrofluoric acid (BHF) to remove LTO, and $NH_4OH:H_2O_2:H_2O$ (standard clean 1 (SC1)) to remove titanium oxide, aluminum oxide. The remaining portions of the sacrificial layer 110 in the spaces a and b are selectively removed with respect to the hardmask portions, liner layers 111 and epitaxial layers 115.

Referring to FIGS. 10A and 10B, isolation regions 120 (e.g., shallow trench isolation (STI) regions) and bottom spacer layers 125 are formed. A plurality of trenches are formed in the substrate 101 and in portions of the epitaxial layers 115, by for example, wet or dry etch processes. Dielectric material including, but not necessarily limited to $SiO_x$, LTO, HTO, flowable oxide (FOX), silicon oxycarbide (SiOC), silicon oxycarbonitride (SiOCN) or some other dielectric, is deposited in the trenches, and in areas 119 left vacant by the removal of the sacrificial layer 110. The dielectric material can be deposited using deposition techniques including, but not necessarily limited to, CVD, plasma enhanced CVD, PECVD, RFCVD, PVD, ALD, MLD, MBD, PLD, LSMCD, and/or sputtering to define the isolation regions 120. As can be seen, top surfaces of the isolation regions 120 are level with or substantially level with top surfaces of the remaining portions of the epitaxial layers 115, which form the bottom source/drain regions. The remaining portions of the epitaxial layers 115 (bottom source/drain regions) are formed directly under the fins 120, which function as the channel regions of the resulting VTFET devices. In illustrative embodiments, referring to FIGS. 4, 11A, and 11B, the remaining portions of the epitaxial layers 115 (bottom source/drain regions) are under entire widths of bottom surfaces of each of the fins 102 (e.g., along X and X' directions), such that an entire bottom surface of each of the fins 102 along a width direction is formed on a bottom/source drain region 115. In other words, the epitaxial layers 115 (bottom source/drain regions) are respectively disposed under an entirety of each of the fins 102 along a width direction (e.g., along X and X' directions). In some embodiments, the isolation regions 120 may have positive (becomes narrower from a top to a bottom of the isolation region) or negative (becomes wider from a top to a bottom of the isolation region) tapered shapes, or no taper.

Bottom spacer layers 125 are formed on the epitaxial layers 115 (bottom source/drain regions) and the isolation region 120. The bottom spacer layers 125 include, but are not necessarily limited to, silicon boron nitride (SiBN), siliconborocarbonitride (SiBCN), silicon oxycarbonitride (SiOCN), SiN or $SiO_x$. According to an embodiment, the bottom spacer layers 125 are deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Alternatively, the spacer material can be deposited using, conformal deposition techniques, and removed from vertical surfaces using directional removal techniques, such as, for example, RIE. Spacer material 125 formed on the hardmask portions 106 can be removed using a planarization process, such as, for example, CMP.

Figure 11A:
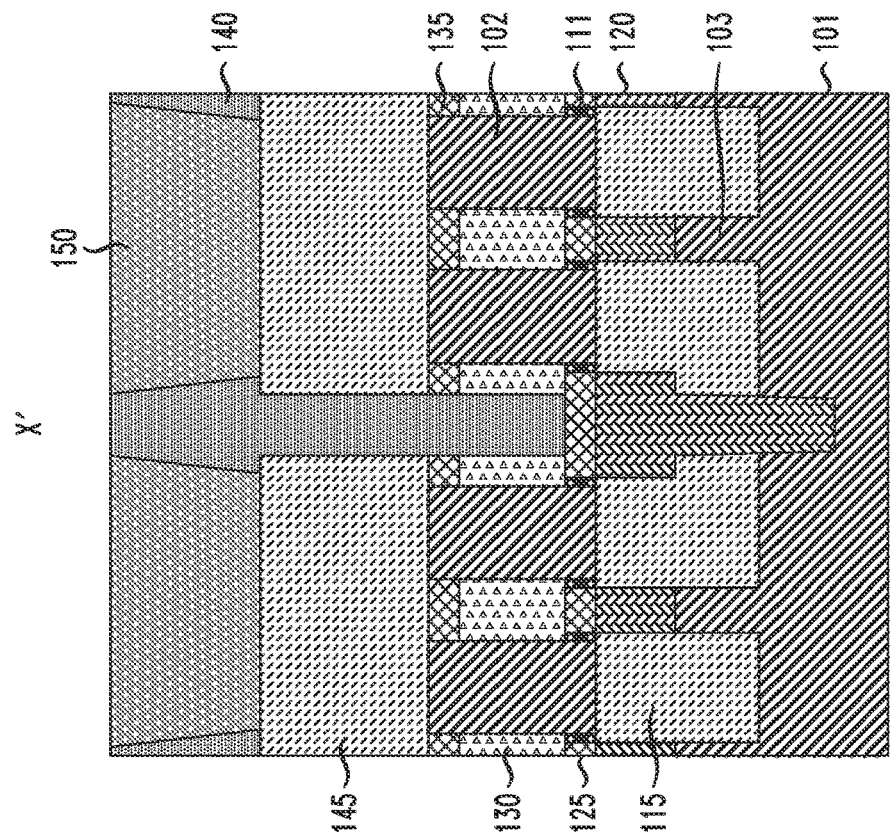
FIG. 11A is a cross-sectional view taken along the line X in FIG. 4 and illustrating gate structure, top spacer, top source/drain region, dielectric fill layer and contact formation in a method of manufacturing a semiconductor device, according to an exemplary embodiment of the present invention.
Figure 11B:
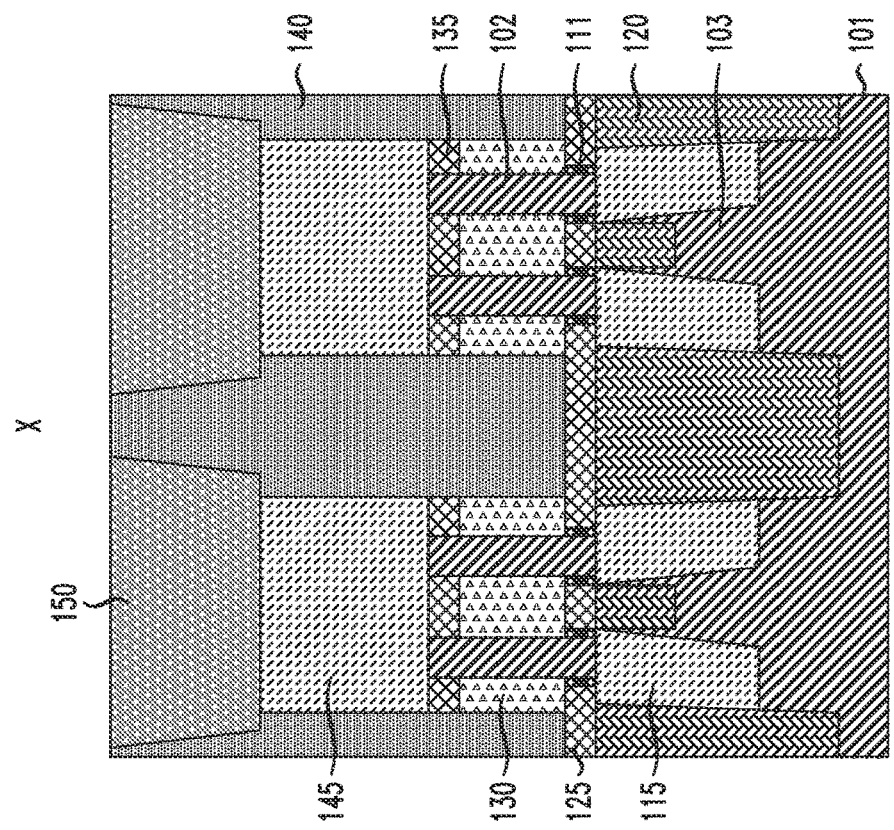
FIG. 11B is a cross-sectional view taken along the line X' in FIG. 4 and illustrating gate structure, top spacer, top source/drain region, dielectric fill layer and contact formation in a method of manufacturing a semiconductor device, according to an exemplary embodiment of the present invention.

Referring to FIGS. 11A and 11B, gate structures 130, top spacers 135, top source/drain regions 145, dielectric fill layer 140 and top source/drain contacts 150 are formed. Gate structures 130 include, for example, gate and gate dielectric layers. The gate dielectric layer includes, for example, a high-K material including, but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate layer includes, for example, a work-function metal (WFM) layer, deposited on the gate dielectric layer, and including, but not necessarily limited to, titanium nitride (TiN), tantalum nitride (TaN) or ruthenium (Ru). The gate layer also includes a gate metal layer deposited on the WFM layer, and including, but not necessarily limited to tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structures 130 are deposited on the bottom spacer layers 125 and around the fins 102, using, for example, deposition techniques including, but not limited to, CVD, PECVD, RFCVD, PVD, ALD, MLD, MBD, PLD, LSMCD, sputtering, and/or plating. Following deposition of the gate structures 130, the gate structures are recessed to height below the top surface of the fins 102. In addition, prior to formation of the gate structures 130, exposed portions of the sidewall liner layers 111 not covered by the bottom spacer layers 125 are removed.

Top spacer layers 135 are formed on upper surfaces of the gate structures 130. Top spacer material is the same or similar to material of the bottom spacer layers 125 and is deposited using the same or similar deposition techniques as that of the bottom spacer layers 125. The hardmask portions 106 and the spacer material formed on the hardmask portions 106 are removed using a selective RIE and/or a planarization process to expose upper portions of the fins 102.

The top source/drain regions 145 are epitaxially grown in an epitaxial growth process from the upper portions of the fins 102. Similar to the bottom source/drain regions 115, the epitaxially grown top source/drain regions 145 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc. Dopants may include, for example, n-type or p-type dopants at various concentrations the same or similar to those used for the bottom source/drain regions depending on whether the device is an n-type or p-type device. The cross-sections in FIGS. 1, 2B, 3B, 5A, 5B, 6A, 6B, 7A, 7B, 8A, 8B, 9A, 9B, 10A, 10B, 11A, 11B refer to a p-type device. However, the same or similar structure applies to an n-type device, with some exceptions for materials and/or doping.

A dielectric fill layer 140 is formed on the top source/drain regions 145 on a bottom spacer layer 125 to fill in gaps between devices 1 and 2. The dielectric fill layer 140 includes, but is not necessarily limited to, $SiO_x$, flowable oxide, or spin-on-glass. According to an embodiment of the present invention, the dielectric fill layer 140 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Trenches are opened in the dielectric fill layer 140 over the top source/drain regions 145 using, for example, lithography followed by RIE. The trenches expose the top source/drain regions 145. Contacts to top source/drain regions 145 are formed in the trenches by filling the trenches with a contact material layer 150, such as, for example, electrically conductive material including, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trenches and on the top source/drain regions 145 before filling the trenches with the contact material layer 150.

Deposition of the contact material layer 150 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

According to one or more embodiments, a VTFET comprises two C-shaped active regions (e.g., fin channel regions) facing opposite directions. The C-shapes of respective adjacent fin channel regions of a single VTFET device (e.g., device 1 or 2) face outside, such that the C-shapes are back-to-back. Bottom source/drain epitaxial regions are formed under the channels. Isolation regions between different devices (e.g., two VTFETs) may have a positive tapered profile, while isolation regions within one device (e.g., between two fins of the same VTFET) may have a negative tapered profile. The space between adjacent fin channel regions of a single VTFET is less than the space between C-shaped active regions of two adjacent VTFETs.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
a plurality of fins disposed on a substrate, wherein respective ones of the plurality of fins include a first portion having a first width, and a second portion having a second width greater than the first width; and
a plurality of bottom source/drain regions respectively disposed under the plurality of fins;
wherein the plurality of bottom source/drain regions are respectively disposed under the plurality of fins along a width direction; and
wherein the respective ones of the plurality of fins comprise a C-shape.

2. The semiconductor device according to claim 1, wherein at least one corner between the first portion and second portion of the respective ones of the plurality of fins is rounded.

3. The semiconductor device according to claim 1, wherein the C-shapes of first and second fins of the plurality of fins face opposite directions from each other, and the first and second fins correspond to a first vertical transistor.

4. The semiconductor device according to claim 3, wherein the C-shapes of third and fourth fins of the plurality of fins face opposite directions from each other, and the third and fourth fins correspond to a second vertical transistor.

5. The semiconductor device according to claim 4, wherein a width of one of a space between the first and second fins of the first vertical transistor and a space between the third and fourth fins of the second vertical transistor is less than a width of a space between ends of the second portions of the second and third fins of the first and second vertical transistors.

6. The semiconductor device according to claim 4, wherein a width of one of a space between the first and second fins of the first vertical transistor and a space between the third and fourth fins of the second vertical transistor is less than a width of a space between adjacent sides of the first portions of the second and third fins of the first and second vertical transistors.

7. The semiconductor device according to claim 4, wherein a width of a space between ends of the second portions of the second and third fins of the first and second vertical transistors is less than a width of a space between adjacent sides of the first portions of the second and third fins of the first and second vertical transistors.

8. The semiconductor device according to claim 1, further comprising a plurality of isolation regions disposed adjacent the plurality of bottom source/drain regions, wherein first isolation regions of the plurality of isolation regions comprise a positive tapered profile and second isolation regions of the plurality of isolation regions comprise a negative tapered profile.

9. The semiconductor device according to claim 8, wherein the first isolation regions are respectively positioned between two vertical transistors, and wherein the second isolation regions are respectively positioned between two fins of the same vertical transistor.

10. The semiconductor device according to claim 1, further comprising:
- a spacer layer disposed adjacent lower portions of the plurality of fins; and
- a plurality of liner layers disposed on sides of respective ones of the lower portions of the plurality of fins between portions of the spacer layer and the sides of the respective ones of the lower portions.

11. A semiconductor device, comprising:
- a plurality of vertical channel regions disposed on a substrate, wherein respective ones of the plurality of vertical channel regions include a first portion having a first width, and a second portion having a second width greater than the first width; and
- a plurality of bottom source/drain regions respectively disposed under the plurality of vertical channel regions;
- wherein the plurality of bottom source/drain regions are respectively disposed under the plurality of vertical channel regions along a width direction; and
- wherein the respective ones of the plurality of vertical channel regions comprise a C-shape.

12. The semiconductor device according to claim 11, wherein at least one corner between the first portion and second portion of the respective ones of the plurality of vertical channel regions is rounded.

13. The semiconductor device according to claim 11, wherein the C-shapes of first and second vertical channel regions of the plurality of vertical channel regions face opposite directions from each other, and the first and second vertical channel regions correspond to a first vertical transistor.

14. The semiconductor device according to claim 13, wherein the C-shapes of third and fourth vertical channel regions of the plurality of vertical channel regions face opposite directions from each other, and the third and fourth vertical channel regions correspond to a second vertical transistor.

15. The semiconductor device according to claim 14, wherein a width of one of a space between the first and second vertical channel regions of the first vertical transistor and a space between the third and fourth vertical channel regions of the second vertical transistor is less than a width of a space between ends of the second portions of the second and third vertical channel regions of the first and second vertical transistors.

16. The semiconductor device according to claim 14, wherein a width of one of a space between the first and second vertical channel regions of the first vertical transistor and a space between the third and fourth vertical channel regions of the second vertical transistor is less than a width of a space between adjacent sides of the first portions of the second and third vertical channel regions of the first and second vertical transistors.

17. The semiconductor device according to claim 14, wherein a width of a space between ends of the second portions of the second and third vertical channel regions of the first and second vertical transistors is less than a width of a space between adjacent sides of the first portions of the second and third vertical channel regions of the first and second vertical transistors.

18. A semiconductor device, comprising:
- a plurality of vertical channel regions disposed on a substrate, wherein respective ones of the plurality of vertical channel regions include a first portion having a first width, and a second portion having a second width greater than the first width;
- a plurality of bottom source/drain regions respectively disposed under the plurality of vertical channel regions;
- wherein the plurality of bottom source/drain regions are respectively disposed under the plurality of vertical channel regions along a width direction; and
- a plurality of isolation regions disposed adjacent the plurality of bottom source/drain regions, wherein first isolation regions of the plurality of isolation regions comprise a positive tapered profile and second isolation regions of the plurality of isolation regions comprise a negative tapered profile.

19. The semiconductor device according to claim 18, wherein the first isolation regions are respectively positioned between two vertical transistors, and wherein the second isolation regions are respectively positioned between two fins of the same vertical transistor.

20. The semiconductor device according to claim 18, wherein the respective ones of the plurality of vertical channel regions comprise a C-shape.

* * * * *